United States Patent [19]

Rose

[11] Patent Number: 4,632,269

[45] Date of Patent: Dec. 30, 1986

[54] WATERPROOF ELECTRICAL ENCLOSURES

[76] Inventor: Friedhelm Rose, 55 Cache Cay, Vero Beach, Fla. 32963

[21] Appl. No.: 837,964

[22] Filed: Mar. 10, 1986

[30] Foreign Application Priority Data

Apr. 29, 1985 [DE] Fed. Rep. of Germany ... 8512613[U]

[51] Int. Cl.$^4$ .............................................. H02G 3/08
[52] U.S. Cl. ...................................... 220/3.8; 220/3.3; 220/327
[58] Field of Search ........................ 220/3.8, 3.94, 3.3, 220/3.7, 4 C, 327, 328, 242

[56] References Cited

U.S. PATENT DOCUMENTS

| | | | |
|---|---|---|---|
| 2,412,719 | 12/1946 | Dausmann | 220/327 |
| 2,891,102 | 6/1959 | Grimes | 220/242 X |
| 3,104,774 | 9/1963 | Hudson et al. | 220/3.94 |
| 3,414,154 | 12/1968 | Rose et al. | 220/3.7 |
| 3,514,562 | 5/1970 | Arnold, Jr. | 220/3.94 X |
| 3,606,064 | 9/1971 | Butler | 220/3.8 |
| 3,659,037 | 4/1972 | MacDonald | 220/3.6 X |
| 4,059,199 | 11/1977 | Quaney | 220/3.8 |
| 4,265,365 | 5/1981 | Boteler | 220/3.3 |

Primary Examiner—Steven M. Pollard
Attorney, Agent, or Firm—Carroll F. Palmer

[57] ABSTRACT

Waterproof electrical enclosures for the encapsulation of electrical and electronic components have a box-like base part to be fixed to a support surface by screws or like mounting fixtures and a sealing cover held to the base part by special fasteners located in special mounting points in the corners of the enclosure. Each mounting point has a single channel extending into the base part which in cross-section size corresponds to the size of the head of a mounting fixture and narrows to an aperture for the shaft of the mounting fixture in the bottom of the base part. There are fasteners fitted through the cover, each with a connection piece thereof larger than the shaft of the fastener, such piece being fixable in the top of a base part channel to connect the cover fastener to the base part.

6 Claims, 5 Drawing Figures

WATERPROOF ELECTRICAL ENCLOSURES

BACKGROUND OF THE INVENTION

1. Field of the Invention

This invention relates to waterproof electrical enclosures for the encapsulated accommodation of electrical and electronic components, e.g., waterproof electrical junction boxes.

2. Description of the Prior Art

The majority of electrical junction boxes and like enclosures are not waterproof, but in a number of different type environments there is a need for the electrical enclosures to be waterproof. This quality in the enclosures has been attained in the past in a variety of ways.

There are known enclosures of the waterproof type comprising a base part and a separate cover in which one channel for accommodating a mounting fixture for the base part and a second separate channel for accommodating fasteners for a cover are formed in the corners of the base part. This arrangement allows for tight connection between the base and cover, but has the disadvantages of (a) reducing the amount of available space within the enclosure and (b) has a negative effect on material requirement and manufacturing costs. The present invention provides unique improvements in such electrical enclosures to mitigate these disadvantages by eliminating multiple channeling in the base part.

It is known in the construction of electrical enclosures to use complex fasteners together with single channels or apertures to fix a base part of the enclosure to a support surface and also a cover for the enclosure to the base part, e.g., see U.S. Pat. Nos. 2,891,102 and 3,659,037. The present invention employs this basic concept in special ways to create waterproof electrical enclosures that are improvements of prior known enclosures of related type.

OBJECTS

A principal object of the invention is the provision of improved forms of waterproof electrical enclosures.

Further objects include the provision of:

1. Such enclosures that are simply constructed and inexpensive to manufacture.

2. Such enclosures that are designed to reduce material requirements for construction and an enlargement in the amount of sealed-off space provided in the enclosure as compared with prior known related devices.

3. Such enclosures that are less complicated to mount on support surfaces and to manipulate the cover than in the past.

Other objects and further scope of applicability of the present invention will become apparent from the detailed description given hereinafter; it should be understood, however, that the detailed description, while indicating preferred embodiments of the invention, is given by way of illustration only, since various changes and modifications within the spirit and scope of the invention will become apparent to those skilled in the art from this detailed description.

SUMMARY OF THE INVENTION

The objects are accomplished, in part, in accordance with the invention by provision of waterproof electrical enclosures having a box-like base part, defined by a bottom and a plurality of sides normal to the bottom joined at corners therein, for mounting to a support surface and a sealing cover with corners corresponding to the corners of the base part for attachment by corner fasteners to the base part.

In the new enclosures, a single base part channel extends through each corner of the base part normal to the bottom. Each of the base part channels has an upper section of first cross-sectional size and a lower section of second cross-sectional size smaller than the upper section.

There is a ledge adjacent the base of the second section that serves to capture the head of a fastener inserted in the channel to mount the enclosure on a support surface.

A single cover channel extends normally through each corner of the cover and each of the cover channels has an upper section of first cross-sectional size, and a lower section of second cross-sectional size larger than the upper section, which is also at least as large as the first cross-sectional size of the base part channel.

Fasteners are fitted through the cover channels that have a shaft of size permitting them to pass through the upper section of the cover channel and a connection piece is fitted to the lower end of the shaft of each of the fasteners. This connection piece is of cross-section greater than the cross-section of the upper section of the cover channel, and there is means to fix each connection piece in the upper section of a respective base part channel.

With the enclosure structured as just described, the single corner channels permit support attachment fasteners to extend through the bottom of the enclosure and also to receive additional fasteners to clamp the cover to the base part. In other words, there is only one channel in each corner of the enclosures for both mounting fixtures and for cover fasteners. This achieves, on the one hand, a saving of construction material with corresponding saving in cost of manufacture as compared with prior known related devices. On the other hand, the apparatus used to manufacture the enclosures are simpler and, hence, less expensive. Moreover, the space available within the enclosures for accommodation of electrical components is increased for any given perimeter size when compared to the conventional double corner channel devices.

The new enclosures of the invention can be constructed of plastics, e.g., by injection or compression molding, or of metal, e.g., aluminum by stamping, casting or the like.

BRIEF DESCRIPTION OF THE DRAWINGS

A more complete understanding of the invention may be had by reference to the accompanying drawings in which.

DESCRIPTION OF THE PREFERRED EMBODIMENTS

Figure 1:
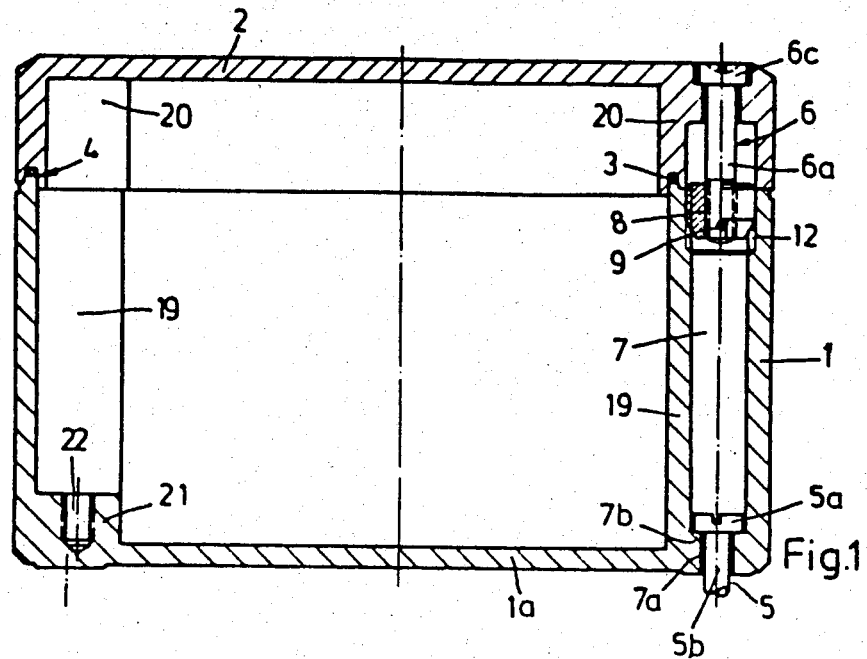
FIG. 1 is a vertical section through an enclosure constructed in accordance with the invention.
Figure 2:
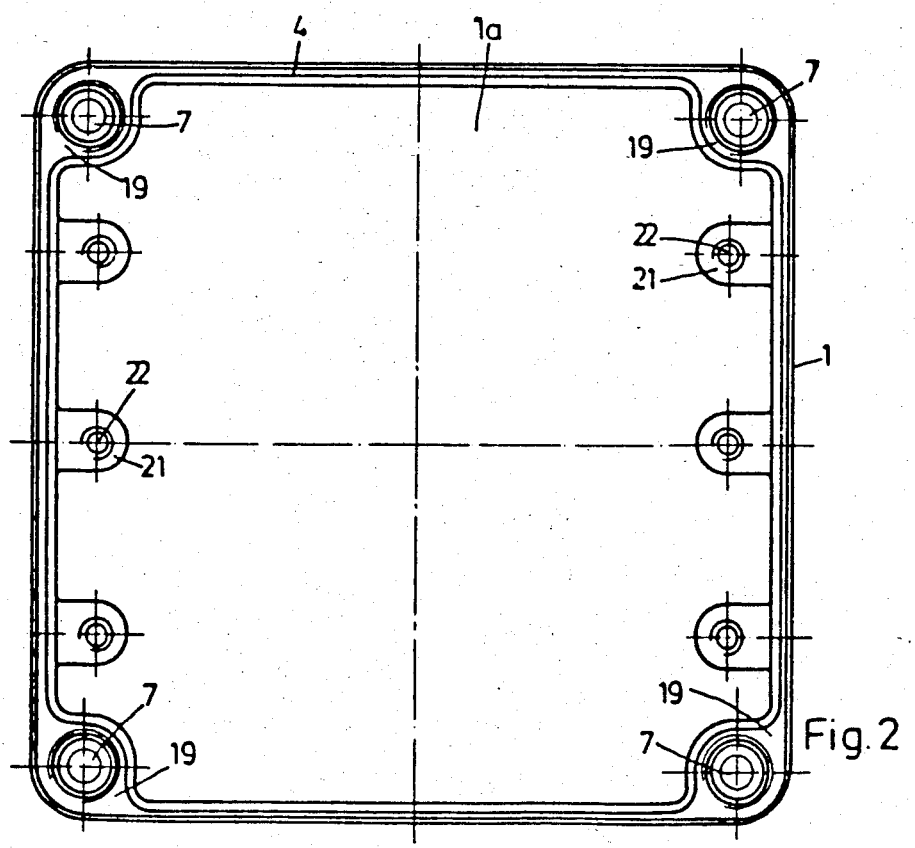
FIG. 2 is a plan view of the base part of the enclosure of FIG. 1.

Referring in detail to the drawings, in which identical parts are identically marked, the invention comprises a box-shaped base part 1 with an angular, preferably quadratic or right-angled cross-section, and a sealing cover 2. The cover 2 grips over the top edge of the base part 1 with a hood lip in line contact with a seal 3 by means of a saddle joint 4.

The base part 1 is mounted on a support surface, e.g., wall of floor, with several mounting fixtures 5, e.g., screws, while the cover 2 is joined to the base part 1 with several fasteners 6, whereby the mounting and fastening points are both located aligned in the corners of the enclosures.

Each mounting and fastening point (in the design shown there are four points) has, incorporated in the base part 1, a single channel 7 which in its lower part has a cross-section corresponding to the size of the head 5a of the mounting fixture 5 and at the bottom end narrows to form a ledge with a through hole 7a for the shaft 5b of the mounting fixture 5. Thus, the mounting fixture (the screw) 5 can be inserted into the channel 7 through its top end and its head 5a comes to rest on the ledge of the hole 7a while the shaft 5b protrudes from the bottom 1a of the base part 1. The base part 1 is then mounted to the support surface using the mounting fixture 5.

The fasteners 6 for the cover 2 fit into the same channel 7 to fasten the cover 2 to the base part 1 with the result that both fasteners 5 & 6 run coaxially and use a common channel 7. This, in turn, results in a single hole mounting and fastening point.

The fastener 6, of which the shaft 6a is smaller than the cross-section of the channel 7 has a connection piece 8 which is of larger cross-section than the shaft 6a to enable such piece 8 to carry out the fastening of the cover 2 to the base part 1. Preferably, as shown, the fastener 6 is a screw with external threads 6b on the shaft 6a to which is fitted the connection piece 8, which has internal threads 8a and external threads 8b. This insert nut type connection piece 8 is screwed on to the shaft 6a and in the screwed in position is secured against turning relative to the shaft 6a.

Figure 3:
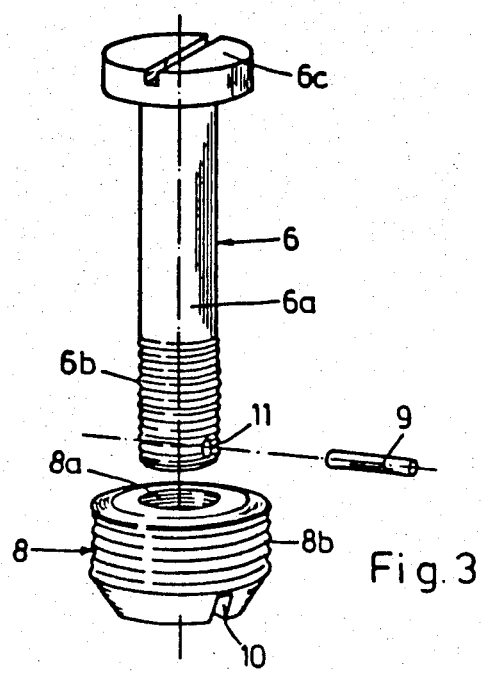
FIG. 3 is an isometric view of a one embodiment of a cover fastener and connection piece used in the new enclosures.

The anti-turning means as shown in FIGS. 1 and 3 is a pin 9, which is fitted through a groove 10 in the connection piece 8 and a hole 11 in the shaft 6a of the fastener 6. The pin 9 is of such length as to set back from the outer threads 8b of the piece 8 when in securing position.

Together with the locked-on connection piece 8, the fastener 6 is then screwed into the thread 12 in the top end of the channel 7.

Figure 5:
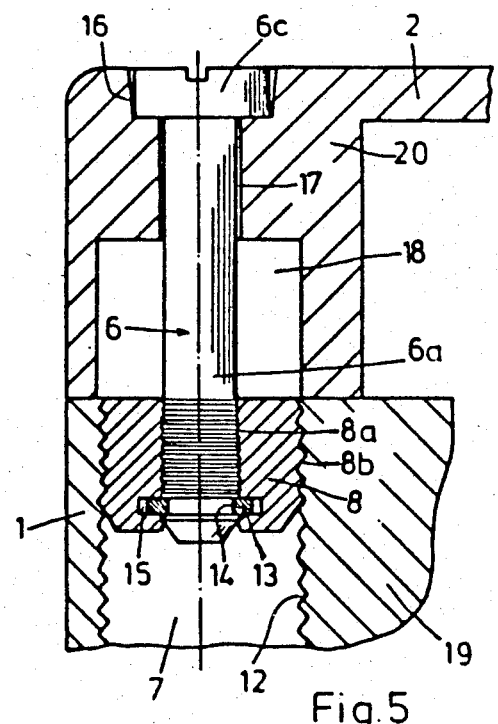
FIG. 5 is an enlarged, fragmentary, sectional view of the enclosure of FIG. 1 in the area where the base part and cover are joined by the fastener shown in FIG. 4.
Figure 4:
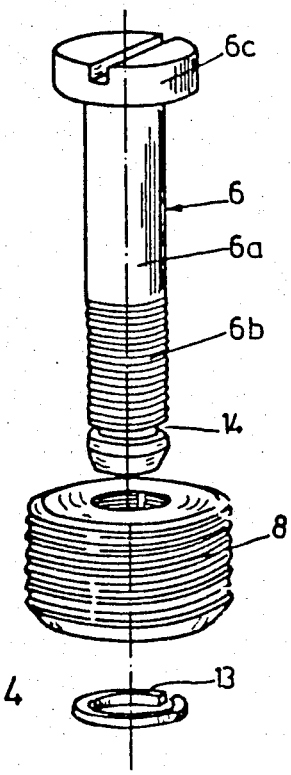
FIG. 4 is an isometric view of a second embodiment of a cover fastener and connection piece used in the new enclosures.

The means as shown in FIGS. 4 and 5 for securing the connection piece 8 to the fastener 6 is a snap-ring 13. In this case, the lower end of the shaft 6a and the inside of connection piece 8 are equipped with circular grooves 14 & 15 respectively. The spring clip 13 is inserted into the groove 15 and when the fastener 6 is screwed into the piece 8, the clip 13 is pressed into the groove 14 of the fastener 6 with the result that the clip 13 comes to rest in both grooves 14 and 15, thus joining the parts 6 and 8 permanently together. It is also of advantage to strengthen this joint with a metallic bonding agent.

Instead of a screw 6, a socket pin with a head (not shown) can also be used as a cover fastener, which is then inserted with its non-threaded shaft into the connection piece 8 without an internal thread and this is then joined to the piece by means of welding, bonding agent, rivets or the like.

The cover 2 has, for the insertion of the fasteners 6, channels made up of a countersunk hole 16 to accommodate the head 6c of the fastener 6, a guide channel 17 for the shaft 6a of the fastener 6 and a widened bore 18 which is at least the size of the upper portion of the channel 7 in the base part 1.

In order to join the fasteners 6 with the connection pieces 8, the fasteners 6 are inserted into the guide channels 17 and the connection pieces 8 can then be screwed or placed on the shaft 6a. Accordingly, each assembly of a fastener 6 and respective connection piece 8 is held captively in the cover 2. The connection pieces 8 take up the free spaces 18 in the cover 2 when it is initially placed on the base part 1. After the cover 2 is so placed, fastening the cover 2 to the base 1 is carried out by tightening the fasteners 6 with connection pieces 8 into the threaded upper portion of the channels 7.

In addition to the preferred embodiments as shown, the invention also encompasses variations using cover fastener and connection piece combinations that use bayonet-type, socket, ratchet or clamp arrangements.

The channels 7 in the base part 1 are contained in the corner sides of material thickenings 19 and stretch from the bottom aperture 7a up through the entire height of the base part 1. Similarly, the through-hole elements 16, 17 and 18 in the cover 2 are recessed in corner material massings 20.

In the interior of the base part 1, there are pedestals 21 with fastening holes 22, e.g., threaded holes, for securing electronic components installed in the new waterproof enclosures.

The embodiments of the invention in which an exclusive property or privilege is claimed are defined as follows:

1. In waterproof electrical enclosures having a box-like base part, defined by a bottom and a plurality sides normal to the bottom joined at corners therein, for mounting to a support surface and a sealing cover with corners corresponding to said corners of said base part for attachment by corner fasteners to the base part, the improvement which comprises in combination:
   a single base part channel extending through each corner of said base part normal to said bottom,
   each of said base part channels having:
       an upper section of first cross-sectional size,
       a lower section of second cross-sectional size smaller than said upper section, and
       a ledge adjacent the base of said second section that serves to capture the head of a fastener inserted in said channel to mount said enclosure on a support surface,
   a single cover channel extending normally through each corner of said cover,
   each of said cover channels having:
       an upper section of first cross-sectional size, and
       a lower section of second cross-sectional size larger than said upper section and at least as large as said first cross-sectional size of said base part channel,
   fasteners fitted through said cover channels having a shaft of size permitting it to pass through said upper section of said cover channel,
   a connection piece fitted to the lower end of said shaft of each of said fasteners which is of cross-section greater than said cross-section of said upper section of said cover channel, and means to fix each said connection piece in said upper section of a respective base part channel.

2. A waterproof electrical enclosure of claim 1 wherein said means to fix comprises external threads on said connection pieces and corresponding internal threads on said upper sections of said base part channels.

3. A waterproof electrical enclosure of claim 1 wherein each said base part channel is contained in a thickened corner portion of said base part.

4. A waterproof electrical enclosure of claim 1 wherein said cover is defined by a planar top portion and a plurality of normally depending sides connected at said corners of said cover.

5. A waterproof electrical enclosure of claim 2 wherein said shafts of said fasteners have threads on their lower ends and said connection pieces have internal threaded portions into which said shafts may thread.

6. In waterproof electrical enclosures having a box-like base part, defined by a bottom and a plurality sides normal to the bottom joined at corners therein, for mounting to a support surface and a sealing cover with corners corresponding to said corners of said base part for attachment by corner fasteners to the base part, the improvement which comprises in combination:

a single base part channel extending through each corner of said base part normal to said bottom, each of said base part channels having:
   an upper section of first cross-sectional size,
   internal threads in said upper sections,
   a lower section of second cross-sectional size smaller than said upper section, and
   a ledge adjacent the base of said second section that serves to capture the head of a fastener inserted in said channel to mount said enclosure on a support surface, a single cover channel extending normally through each corner of said cover, each of said cover channels having:
   an upper section of first cross-sectional size,
   a lower section of second cross-sectional size larger than said upper section and at least as large as said first cross-sectional size of said base part channel, fasteners fitted through said cover channels having a shaft of size permitting it to pass through said upper section of said cover channel, a connection piece fitted to the lower end of said shaft of each of said fasteners which is of cross-section greater than said upper section of said cover channel, and external threads on each said connection piece to thread into said said threads of said upper sections of said base part channels.

* * * * *